US005592558A

United States Patent [19]

Stuhlfelner et al.

[11] Patent Number: 5,592,558

[45] Date of Patent: Jan. 7, 1997

[54] SOUND REPRODUCTION DEVICE

[75] Inventors: Friedbert Stuhlfelner, Leiblfing, Germany; Harri Valio, Tampere, Finland

[73] Assignee: Nokia Technology GmbH, Germany

[21] Appl. No.: 528,728

[22] Filed: Sep. 15, 1995

[30] Foreign Application Priority Data

Sep. 30, 1994 [DE] Germany .......................... 44 35 224.7

[51] Int. Cl.[6] ................................ H04R 5/00; H03G 3/00

[52] U.S. Cl. ............................ 381/18; 381/17; 381/104; 381/109

[58] Field of Search ................................ 381/18, 17, 19, 381/1, 104, 109, 119

[56] References Cited

U.S. PATENT DOCUMENTS 3,397,286 8/1968 Prewitt et al. .
4,856,065 8/1989 Takagi et al. ............................ 381/28
4,866,774 9/1989 Klayman .................................... 381/1
4,933,768 6/1990 Ishikawa et al. ......................... 381/17
5,054,077 10/1991 Suzuki .................................... 381/109
5,060,272 10/1991 Suzuki .................................... 381/109
5,216,718 6/1993 Fukuda ...................................... 381/19
5,325,435 6/1994 Date et al. ................................. 381/1
5,504,819 4/1996 Fosgate .................................... 381/18
5,524,053 6/1996 Iwamatsu ................................. 381/17

FOREIGN PATENT DOCUMENTS 4106844 9/1992 Germany .
4303386 8/1994 Germany .

*Primary Examiner*—Curtis Kuntz
*Assistant Examiner*—Xu Mei
*Attorney, Agent, or Firm*—Ware, Fressola, Van Der Sluys & Adolphson

[57] ABSTRACT

The invention introduces an arrangement which maintains the usefulness of a fader control (11) connected for example to an audio signal source (10), and at the same time considerably reduces the circuit cost. This is realized in that the distribution to different listening areas adjusted by the fader control (11) is determined from the audio signals that are present behind the fader control (11). To that end, first the audio output signals (L, R) are reconstructed in two adders (12.2, 12.3) and routed to a fourth adder (12.4). Two each audio signals ($L_V$, $R_V$) are routed to a first adder (12.1). The signals existing behind the adders (12.1/4) are then placed into a ratio with each other by a divider (20). From the quotient Q determined there, the distribution rate is then determined by a calculator (21) and made available to the multipliers (M1-4). Devices (17) to determine the average level value, followed by smoothing devices (18), which are positioned symmetrically with respect to the adders (12.1/4).

7 Claims, 3 Drawing Sheets

SOUND REPRODUCTION DEVICE

TECHNICAL FIELD

The invention concerns the reduction of channels in sound reproduction devices, which comprise an audio signal source, a fader control and a device for the digital processing of audio signals, which is connected downstream of the two units named above.

BACKGROUND OF THE INVENTION

Sound reproduction devices with a digital audio signal processor connected downstream of the audio signal source are well known in the state of the art, so that no further details need be provided here. If the audio signal source is one that contains two separate audio signal channels for the stereophonic transmission of sound events, and if a fader control is connected downstream of the audio signal source, which distributes the audio output signals in the sound channels to two different output channels of the fader control, the state of the art recognizes two solutions which make the stereophonic audio signals accessible to digital processing.

Before providing further details, the function of a fader control will be explained. In a very simple configuration this is an adjustable voltage divider, which divides the total resistance of the respective voltage divider into two individual resistances by changing the adjustment, thereby dividing an existing total voltage into manageable individual voltages. In audio signal sources containing two audio signal channels for the stereophonic transmission of sound events, and a fader control connected downstream of them, an adjustable voltage divider is provided for each audio signal channel. These two voltage dividers, which have total resistances of equal size, are connected to each other in such a way, that an equal proportion is provided to the respective individual resistances for each voltage divider, in accordance with the adjustment of the fader control. If the audio output signals that exist in the two audio signal channels pass through such a fader control, two audio signals with equal oscillations can be obtained from each audio output channel. The amplitude of the audio signals with equal oscillations can either be the same or of different size, depending on the ratio of the respective individual resistances to each other. Such a fader control can be used for example to divide a two-channel audio in a motor vehicle between two front and two rear loudspeakers, i.e. an audio that can be heard between two—for example front—loudspeakers, can also be heard between two other loudspeakers. Depending on the configuration, the fader control can be an integral component of the audio signal source, perhaps in the form of a car radio, or it can be positioned away from the audio signal source, perhaps on the vehicle's center console.

If the audio signal source contains such a fader control, and if the audio signals are routed to a device for the digital processing of audio signals, depending on the number of output channels in the fader control, four high quality i.e. audio-signal-suitable A/D (Analog/Digital) converters are required to route the audio signals, which were "divided" by the fader control, to a digital processor. A further consequence is that the digital signal processing must also be performed in four channels.

However, since the fader control only has the function of dividing the two-channel sound information between two loudspeaker groups (front and rear loudspeaker groups), it is desirable to subject only the audio output signals that exist in both audio signal channels to digital audio processing, and only then to perform the division for the two loudspeaker groups. Although such a construction has the advantage that only two audio-signal-suitable A/D converters are required, it must be seen as a disadvantage that a fader control of the kind that is integrated in many audio signal sources cannot be used to distribute the sound information to the two loudspeaker groups, but that a separate fader control must be used. In addition, there is often no room for a digital audio signal processor near the audio signal source, so that a number of sometimes lengthy connection lines is necessary between the separate fader control and the device for the digital processing of audio signals, if the separate fader control must be positioned away from the device for the digital processing of audio signals, perhaps in the vicinity of the audio signal source.

The latter applies to both the case where a separate fader control is one as already explained in detail above, as well as for the case where the fader control function is taken over by another regulating device which, depending on the adjustment, directly affects the processors of the device for the digital processing of audio signals.

If the audio signal source is equipped with an integrated fader control, and if the digital signal processing takes place in two channels using an additional fader control, additional measures must be taken to ensure that the audio output signals are available in two-channels before the fader control, independently of the adjustment of the fader control connected to the audio signal source, for the audio signals to be processed by the digital device. Since it cannot be dismissed that a service person may leave the adjustment of the fader control in the audio signal source unchanged, this can only be realized by creating two more outputs in the audio signal source from which the audio output signals can be obtained, regardless of the adjustment of the fader control connected to the audio signal source.

DISCLOSURE OF INVENTION

It is therefore the task of the invention to present a sound reproduction device, which lessens the switching requirement of the known devices, while simultaneously using conventional fader controls, i.e. which operate according to the voltage divider principle.

According to the invention, a pair of audio output signals from an audio source that are provided to a fader, which in turn provides separate pairs of audio outputs, are reconstructed from the separate pairs from the fader in second and third adders which have their outputs routed to a fourth adder. Additionally, one of the separate pairs of audio signals is routed to a first adder. The separate pairs of signals provided to the first adder and the second and third adders are then placed into a ratio with each other by a divider. From the quotient determined by the divider, the distribution rate is then determined by a calculator and made available to a plurality of multipliers connected to the outputs of the second and third adders. Devices to determine the average level value followed by smoothing devices may be positioned symmetrically with respect to the various adders.

If a device exhibits the combination of characteristics indicated above, not only is it possible to reconstruct the two original output signals (L, R), i.e. upstream of the fader control in the audio channels ($TK_L$, $TK_R$), using this arrangement with the audio signals ($L_V$, $R_V$, $R_H$ $L_H$) existing in the output channels ($AK_1$–$AK_4$) of the fader control, and to route them to a two-channel A/D converter for further processing, but also to determine the existing distribution of the audio output signals (L, R) to the different output channels ($AK_1$–$AK_4$), without needing expensive components, or more connection lines between the fader control and the device for the digital processing of audio signals, than the already existing output channels behind the fader control. According to the teachings hereof, the audio output signals (L, R) that are already distributed by a conventional fader control to different listening areas (front/back), can be used to route audio output signals (L, R), which are essentially processed in two channels, by means of the simultaneous separation of the distribution rate adjusted in the fader control, to different listening areas.

A respective first, second and third adder is provided to reconstruct each of the two audio output signals (L, R) existing in audio channels ($TK_L$, $TK_R$). Each of these two adders is connected to two such output channels of the fader control, from which two respective audio signals ($L_V$, $L_H$ or $R_V$, $R_H$), intended for different listening areas (front or rear), but originating from the same audio signal channel, can be obtained. Each composite signal generated in the two adders, which corresponds in amplitude and oscillation to the respective audio output channel (L, R), is routed to an audio-signal-suitable A/D converter, and is therefore accessible for digital, channel-type signal processing.

A first adder is provided to determine the respective adjustment of the distribution rate in the fader control. This first adder is connected to two output channels, in which one audio signal ($L_V$, $L_H$ or $R_V$, $R_H$), which is intended for the same listening areas but originates from different audio signal channels ($TK_L$ or $TK_R$), can be obtained.

If the composite signals existing downstream of the second and third adder are routed to a fourth adder, the distribution rate existing in the fader control can be determined by letting a divider place the composite signals existing downstream of the first and the fourth adder into a ratio with each other. In other words, the quotient resulting from the division is a value that indicates in what quantity the respective audio signals (L, R) are transmitted to the two listening areas (front/rear). To that end, the quotient is routed to a calculator to determine the signal distribution that is decisive for both listening areas from the quotient, for example by determining the complementary quotient that makes the respective quotient equal to 1. The respective quotients and their complementary quotients, which are called factors in this application, can be used to influence the digital composite signals Sum 2, Sum 3, which exist in the two signal channels ($SK_2$, $SK_3$) after the A/D conversion, with respect to the distribution rate adjusted in the fader control. To that end it is necessary that after the A/D conversion, each of these signal channels ($SK_2$, $SK_3$) is divided into at least two signal channels ($SK_{2.2/3}$, $SK_{3.2/3}$) that are parallel to each other, and is routed to one respective multiplier. If the two factors determined by the calculator are made available by a data line for example to two multipliers located in different signal channels, digital audio signals exist downstream of the multipliers, whose distribution rate corresponds to the rate adjusted in the fader control.

In principle, it is not important where the fourth adder, the divider and the calculator are located in the circuit, insofar it is ensured that the factors are made available to the respective multipliers in digital form. This can mean that the composite signals existing downstream of the second and third adder are routed as analog signals to the fourth adder, and from there—in the same way as the analog signal existing downstream of the first adder—are routed to the divider and the calculator, and only then is an A/D conversion performed.

Since at least each channel that is connected to a first and fourth adder contains at least one device for determining the average level value, and since each of these devices is followed by a smoothing device in the signal channel, it is essentially more advantageous if the A/D converters are directly connected to the adders, i.e., the A/D conversion is performed immediately after the first to third adder, and at least the determination of the average level value and the subsequent smoothing takes place in digital form.

Particularly good results are obtained if, with respect to the first and fourth adder, the respective devices for determining the average level value and the respective smoothing devices are symmetrically arranged. This symmetry has the effect that the phase problems, which are unavoidable when different channel audio signals are added, are not very weighty, because the otherwise occurring problems no longer exist for the reconstruction of the distribution rate after the division, because the composite signals are equal downstream of the first and fourth adder and up to the level. A symmetrical arrangement is provided if, with reference to the two summation points (in the first and the fourth adder), all devices for determining the average level value are either located upstream or downstream of the respective adder.

Extreme phase problems, which occur for example when sound signals, which are displaced by 180°, exist in the output channels routed to the first adder, are excluded where the devices for determining the average level value are connected upstream of the first adder, because each channel that is routed to the first adder is preceded by a device in the form of a rectifier, for determining the average level value.

How the determination of the average level value is obtained makes no difference in principle. For example, it can be organized according to the absolute value or the squared value method. However, it is of special advantage if the device for determining the average level value operates according to the absolute value method. This is so because, in contrast to the squared value method, with the absolute value method sufficient differentiating average level values, i.e. subject to fewer tolerances, are available at the inputs to the A/D converters, even at very low NF (low frequency) voltages.

If a threshold device is upstream of the divider, it excludes divisions by 0 on the one hand. On the other, the threshold device ensures that the total level value, which is available downstream of the fourth adder, exceeds a certain threshold in order to achieve a stable formation of the quotient. In other words, in the sense of the latter function, the threshold device will ensure that otherwise existing and very small total signal levels that would otherwise lead to an adulteration or an instability during the formation of the quotient are avoided.

It is of special advantage if the components that are arranged between the outputs of the fader control and the inputs of the A/D converters, are combined by an adapter. This is so because such an adapter is small in size and can therefore easily be located in the immediate vicinity of the fader control. If the adapter is located in the immediate vicinity of the fader control, and if the fader control is at a large distance from the device for the digital processing of audio signals, only three guide channels are required to contact them.

These and other objects, features and advantages of the present invention will become more apparent in light of the detailed description of a best mode embodiment thereof, as illustrated in the accompanying drawing.

BEST MODE FOR CARRYING OUT THE INVENTION

The invention will now be explained in more detail by means of the figures.

Figure 1:
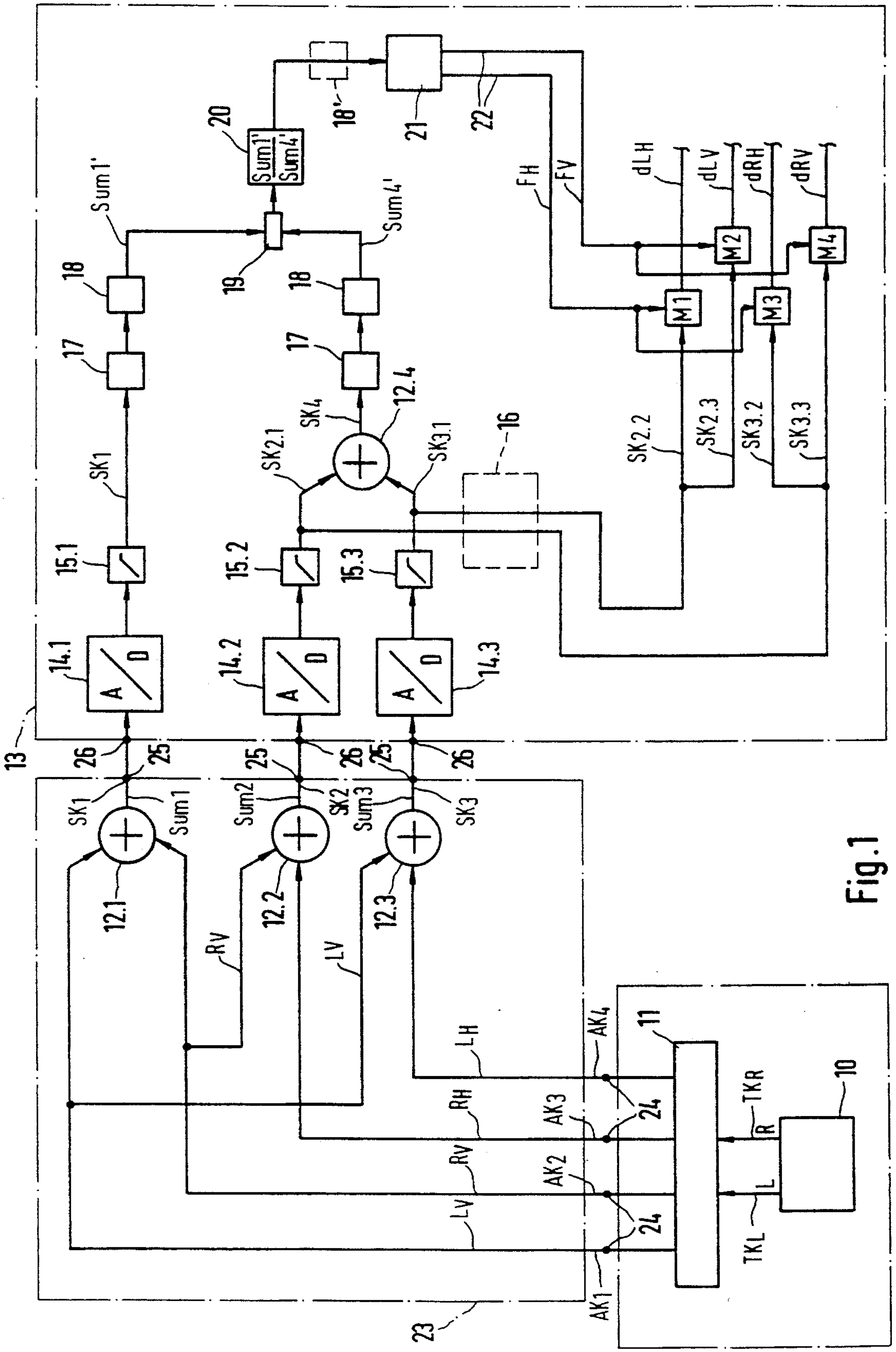
FIG. 1 is a block circuit diagram in accordance with the invention.

The block circuit diagram illustrated in FIG. 1 depicts an audio signal source 10, which has two audio signal channels $TK_L$, $TK_R$ available. These audio signal channels TK contain two audio output signals L, R, which in the present configuration example guide the two signals of a stereophonically transmitted sound event. A fader control 11, which operates according to the voltage divider principle, is connected to the audio signal source 10. The two audio signal channels TK are routed to this fader control 11. Depending on the adjustment of the fader control 11 selected by an operator—as explained in detail earlier—the audio output signals L, R are separated into two listening areas, namely the front and the rear listening areas (indicated by the respective indexes), and routed to the respective output channels $AK_{1-4}$.

In the present configuration example, the audio signal source 10 and the fader control 11 form a unit (indicated by the broken line surrounding the two components 10, 11). Such units are known from car radios, for instance.

The audio signals $L_V$ and $R_V$, i.e. the audio signals provided for the front listening area, are routed through output channels $AK_1$, $AK_2$ to a first adder 12.1, which forms a composite signal Sum 1 from the two audio signals $L_V$ and $R_V$.

The pairs of audio signals $L_V$, $L_H$ and $R_V$, $R_H$, which are directed to the different listening areas but originate from equal audio signal channels $TK_L$ or $TK_R$, are routed—audio channelwise—via the respective output channels $AK_{1-4}$ one such pair to each adder 12.2, 12.3. In the present case this is in such a way, that the audio signals $R_{V/H}$ originating from the right audio signal channel $TK_R$ are routed to adder 12.2, and the audio signals $L_{V/H}$ originating from the left audio signal channel $TK_L$ are routed to adder 12.3.

One each adder output channel $SK_{1-3}$ is provided by the respective adders 12.1–3, to which the composite signals Sum 1–3 formed in the adders 12.1–3 are routed. Because of the addition performed in adders 12.2, 12.3, each of the respective adder channels $SK_{2/3}$ has available a composite signal Sum 2/3, which corresponds to the respective audio output signals L, R.

Further processing of the composite signals Sum 1–3 takes place in a device 13 for the digital processing of (audio) signals. To that end, each signal channel $SK_{1-3}$ coming out of an adder 12.1–3 is routed to an A/D converter 14.1–3. The A/D converters 14.2, 14.3 are converters suitable for audio signals and should have a resolution of greater than or equal to 16 bits. Such a high resolution is not required for A/D converter 14.1. Rather, it is sufficient if this A/D converter has a resolution of greater than or equal to 8 bits. In the present case, a converter named "Codec one" was used which, in addition to two audio-signal-suitable A/D converters 14.2, 14.3 with a resolution of 16 bits each, and almost as a byproduct, also has an A/D converter with a resolution of 12 bits, which was used as A/D converter 14.1.

Each converter 14 is followed by a high-pass filter 15 to exclude D.C. voltages.

After the composite signals Sum 2/3 have passed through the respective high-pass filter 15, each signal channel $SK_{2/3}$ is divided into three parallel adder channels $SK_{2.1-3}$, $SK_{3.1-3}$. Each of two of the three adder channels, which have reference numbers $SK_{2.2\ or\ 3}$, or $SK_{3.2\ or\ 3}$, contains a multiplier M1–4.

It should be pointed out for the sake of completeness that before the adder channels $SK_2$, $SK_3$ are split up into the respective adder channels $SK_{2.2/3}$ or $SK_{3.2/3}$, the signals which are transported in these channels undergo another channel-type digital process. The latter is indicated by the broken line block 16.

The signal channels $SK_{2.1}$, or $SK_{3.1}$ are routed to a fourth adder 12.4. A composite signal Sum 4, formed from the two existing composite signals Sum 2/3 in adder 12.4, is supplied as an adder output channel $SK_4$, which is provided by adder 12.4 to a device 17.

Each adder channel $SK_1$, $SK_4$ contains a device 17 for determining the average level values, which respectively follows the high-pass filter 15.1 or the fourth adder 12.4. This device 17 determines the average level values in accordance with the absolute value method.

Each device 17 is followed by a smoothing device 18, which converts the determined average level values according to an algorithm. A possible realization will be explained here as an example. The significant criteria, which flow into this algorithm and cause the conversion of the average level values, are:

i(t)=average level value according to the calculation in device 17 o(t)=smoothed level after performing the calculation in the smoothing device 18

$t_s$=sampling time=1 sampling frequency $t_a$=attack time $t_r$=release time $b_a$=exp(−ts/ta) and $b_r$=exp(−ts/tr).

The smoothing function $o(t-t_s)$ is:

$$o(t+t_s)=i(t)+[b_a+b_r][1/2][o(t)-i(t))]+[b_r-b_a][1/2]|[o(t)-i(t)]|$$

After devices 18, the smoothed composite signals Sum 1', Sum 4' are routed to a threshold device 19. This threshold device 19 is designed so that, when the respective composite signal Sum 4' is equal to 0, only composite signal Sum 1' is processed further. This prevents the divider 20 that follows the threshold device 19 from dividing by 0. In addition, the design of the threshold device 19 ensures that the existing smoothed composite signal Sum 4', which corresponds to the total NF level, exceeds a certain threshold in order to be able to form a long-term-stable quotient Q in the divisor 20 following the threshold device 19. By dividing Sum 4' into Sum 1', divisor 20 determines the quotient Q, which is supplied to the calculator 21 following divisor 20. Insofar as required, another smoothing device 18' (depicted by broken lines) can be placed between divisor 20 and calculator 21.

Two factors $F_V$, $F_H$ are determined by the calculator 21 from the respective quotients Q made available with another algorithm. The factor determination can for example be realized, so that for quotients Q, which are greater/equal to 0.5:

$$F_V=1$$

and $$F_H=2\ (1-Q)$$

and for quotients Q that are smaller than 0.5:

$F_V=2Q$ and $F_H=1$.

In the configuration example depicted here, each of these factors $F_V$, $F_H$ determined by calculator 21 is made available to the multipliers M1–4 through a data line 22. In that case factor $F_H$, which represents the signal distribution to the rear listening area, is routed to multipliers M1/3, and factor $F_v$, which represents the signal distribution to the front listening area, is routed to multipliers M2/4, so that after the corresponding multiplication, the audio signals $L_V$, $R_V$, $L_H$, $R_H$, with their distribution rate according to fader control 11, are present as audio signals $dL_{H/V}$, $dR_{V/H}$ at the outputs of multipliers M1–4.

The broken line 23 indicates that the components located between the fader control 11 and the device 13 (essentially the adders 12.1–3) have been combined in an adapter 23. Since such an adapter 23 is relatively small in size, it can very easily be positioned in the vicinity of the fader control 11. Since the device 13 for the digital processing of audio signals must often be positioned at a great distance from the fader control 11, the illustration in FIG. 1 shows clearly that if an adapter 23 that is connected to the outputs 24 of the fader control 11 is used, it is only necessary to route three signal channels from the outputs 25 of adapter 23 to the inputs 26 of the device 13 for the digital processing of audio signals, which is located at a distance.

Figure 2:
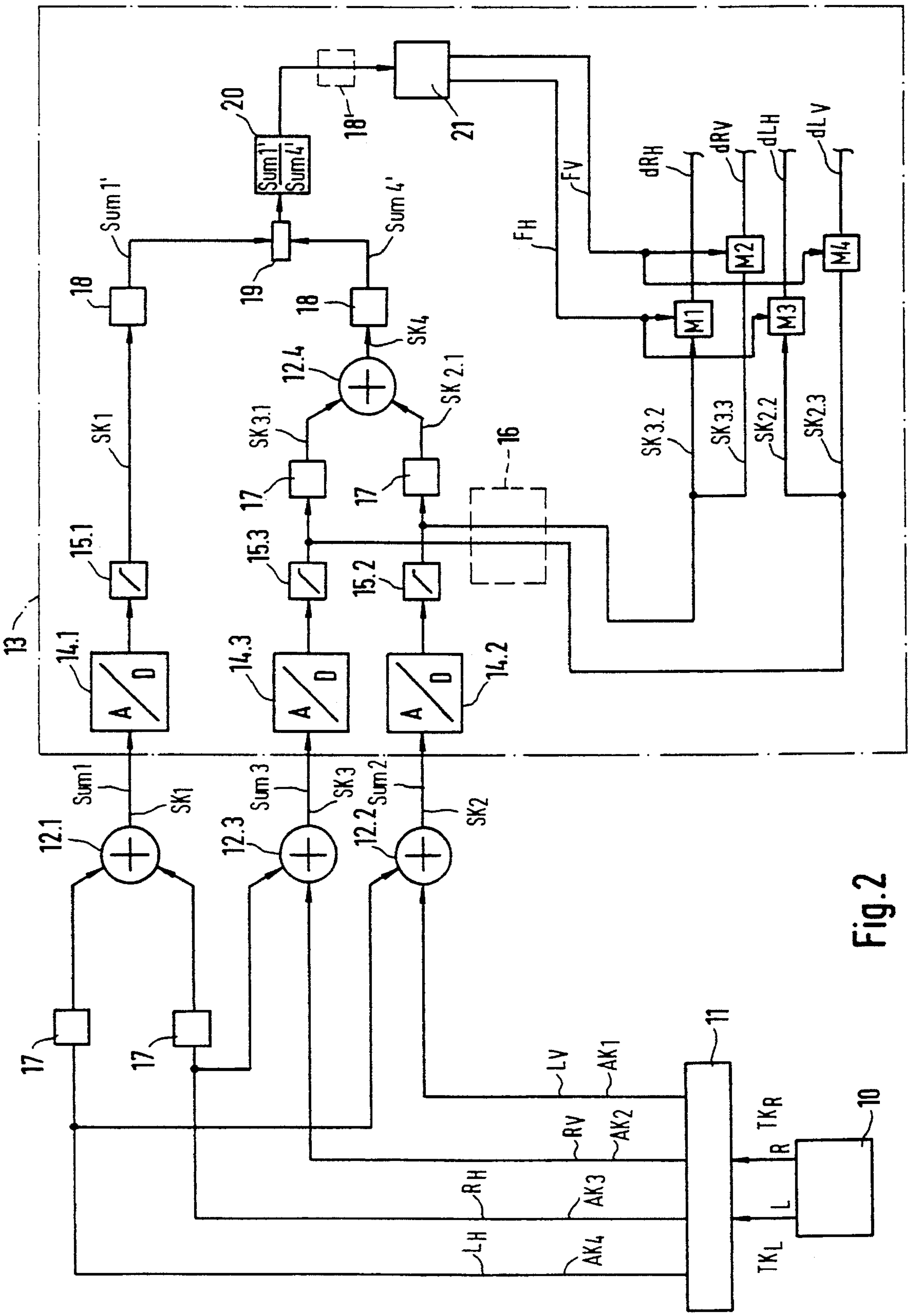
FIG. 2 is another block diagram in accordance with the invention.

The device in FIG. 2 differs from the illustration in FIG. 1 in that the output channels $AK_{3/4}$, instead of the output channels $AK_{1/2}$, are routed to the first adder 12.1. Furthermore the output channels $AK_3$, $AK_4$, which are routed to the first adder 12.1, contain the devices 17 for determining the average level value. In the present instance, these devices 17 are constructed as rectifiers.

The arrangement of the rectifiers 17 before the first adder 12.1 makes certain that with audio signals $L_V$, $R_V$ in phase opposition the sum signal Sum 1 created in the first adder 12.1 is not equal to zero. Furthermore, the rectification of the audio signals $L_V$, $R_V$ in the output channels $AK_3$, $AK_4$ contributes towards eliminating phase problems, which otherwise could also occur during (their) addition with audio signals $L_V$, $R_V$ which are not completely in phase opposition coming from different sound channels Tk. The latter has its origin in that, according to the teachings of the present invention, the addition of averaged (individual) level values in adder 12.1 is entirely sufficient to reconstruct the distribution downstream of fader control 11. In spite of positioning the devices 17 before the first adder 12.1, the symmetry with the fourth adder 12.4 is not disturbed, since with the fourth adder 12.4 as well, the devices 17 precede the respective signal channels. The respective smoothing devices 18 are connected into the signal path downstream of the respective adders 12.1/4. Locating the smoothing devices 18 immediately downstream of adders 12.1, 12.4 is not mandatory. Rather, the respective smoothing devices 18 can also be positioned in another (not illustrated) configuration example between devices 17 and the respective adders 12.1/4.

Figure 3:
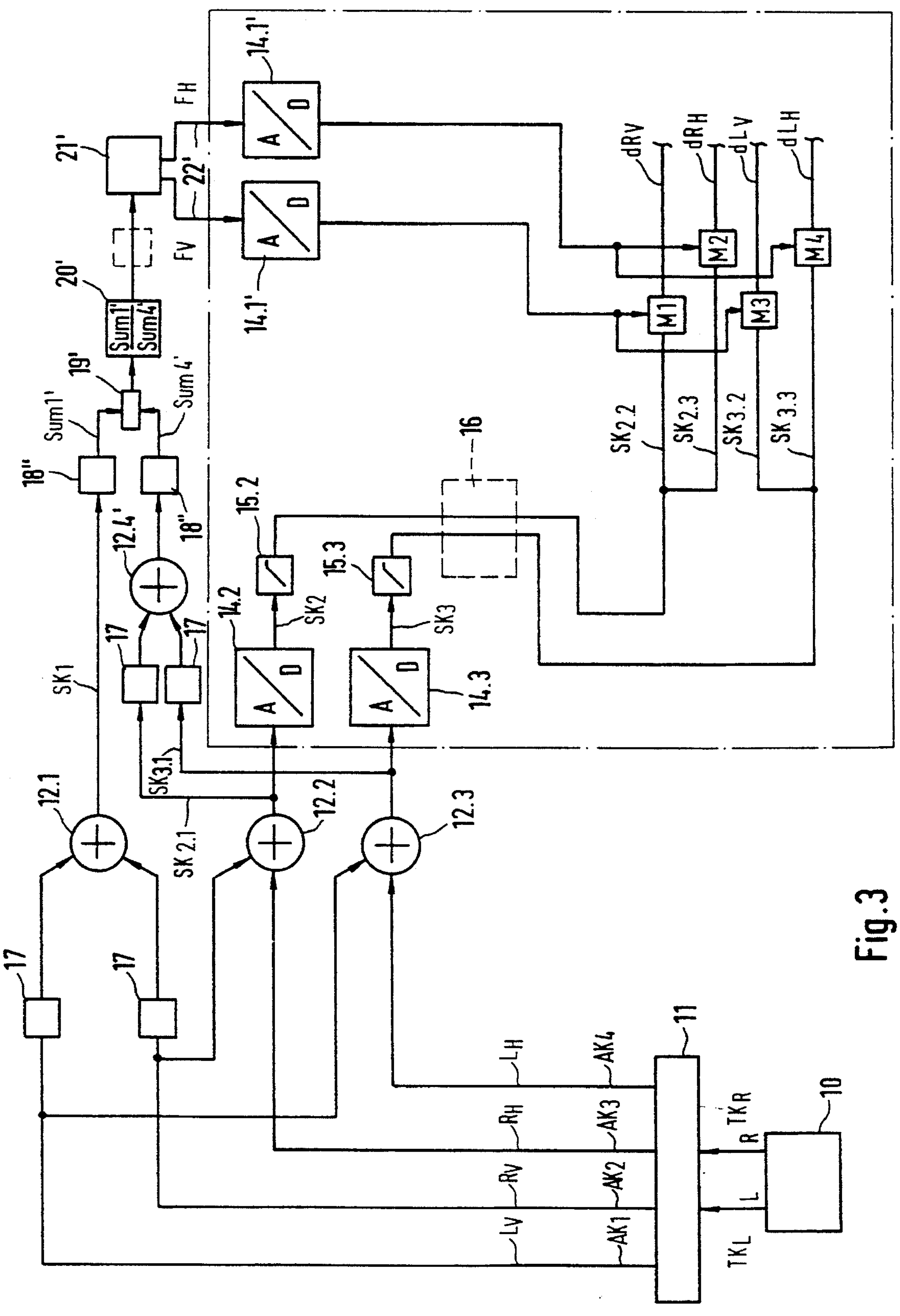
FIG. 3 is another block circuit diagram in accordance with the invention.

In the configuration example illustrated in FIG. 3, the reconstruction of the distribution rate adjusted in the fader control 11 is realized in a purely analog way. To that end, two signal channels $SK_{2.1}$, $SK_{3.1}$ branch off from each signal channel $SK_{2/3}$ downstream of the second and third adder 12.2/3, but before device 13 for the digital processing of audio signals, and are routed to a fourth adder 12.4'. As already explained in conjunction with FIG. 2, since each of the output channels $AK_{3/4}$ has a rectifier arrangement as device 17, a rectifier device 17 is also connected to each of the channels routed to the fourth adder 12.4'.

Smoothing of the summed signals that are provided by the two adders 12.1, 12.4' takes place in a smoothing device 18". After that, the smoothed signals are routed to a threshold device 19'. The divider 20', in which the quotient Q' is determined, has an input connected to the output of the threshold device 19'. From this quotient Q', the calculator 21' that follows the divisor 20' determines the two factors $F_V$, $F_H$, which are then routed through data line 22' to an A/D converter 14.1'. The converted factors $F_{V/H}$ are then supplied to the corresponding multipliers M1–4 in the already explained manner, so that the digitalized audio signals with their corresponding distribution to the different listening areas can be obtained from the outputs of multipliers M1–4.

The use of two A/D converters 14.1' according to FIG. 3 can be omitted, if an A/D Converter 14.1' is used instead and is positioned in the signal path between the divisor 20' and the calculator 21' (indicated by the broken line box in FIG. 3).

It should be pointed out in this connection that in a not illustrated configuration example, the analog factors $F_{V/H}$ according to FIG. 3 can be routed to analog adjusters, which are connected into the signal paths behind the A/D converter. In that case the multipliers M1–4 are omitted.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. Sound reproduction device, with an audio signal source (10) comprising two separate audio signal channels ($TK_L$, $TK_R$) for the stereophonic transmission of sound events, with an adjustable fader control (11) to which the two audio signals ($TK_L$, $TK_R$) are routed, and in which the audio output signals (L, R) existing in the two audio signal channels ($TK_L$, $TK_R$) are divided into two audio signals ($L_H$, $R_H$ or $L_V$, $R_V$) in two channels, and are routed to the output channels ($AK_1$ to $AK_4$), and with a device (13) for the digital processing of audio signals, which follows the fader control (11) and has at least two audio-signal-suitable analog-to-digital (A/D) converters (14) available, each followed by a signal channel (SK), wherein a first adder (12.1) is provided and connected to two output channels ($AK_1$, $AK_2$ or $AK_3$, $AK_4$), which conduct audio signals ($L_H$, $R_H$ or $L_V$, $R_V$) intended for equal front or rear listening areas for providing a first summed signal (Sum 1) in a first signal channel ($SK_1$), wherein a second and third adder (12.2, 12.3) is provided and each of these adders (12.2, 12.3) is connected to two respective output channels ($AK_1$, $AK_3$ or $AK_2$, $AK_4$), which conduct audio signals ($L_H$, $R_H$ or $L_V$, $R_V$) intended for different front and rear listening areas, but which originate from equal audio signal channels ($TK_L$ or $TK_R$) for providing second and third composite signals in respective second and third signal channels ($SK_2$, $SK_3$), wherein each of the second and third composite signals (Sum 2 to Sum 3) from the respective second and third adder (12.2, 12.3) is routed to one of the audio-signal-suitable A/D converters (14.2, 14.3), wherein each of the second and third signal channels ($SK_2$, $SK_3$) is divided into at least three parallel signal channels ($SK_{2.1-3}$ or $SK_{3.1-3}$), wherein one multiplier of the four multipliers (M1–4) each is assigned to at least two of the respective three parallel signal channels ($SK_{2.2}$, $SK_{2.3}$, $SK_{3.2}$, $SK_{3.3}$), wherein a fourth adder (12.4) is provided, to which the composite signals (Sum 2, Sum 3) formed in the adders (12.2/3) are routed, for providing a fourth summed signal (Sum 4) in a fourth signal channel ($SK_4$), wherein the channels connected to the respective adders (12.1–3) include at least one averaging device (17) for determining an average level value, wherein the respective averaging devices (17) for determining an average level value are followed by a smoothing device (18) in the channel, wherein the first and fourth signal channels ($SK_1$, $SK_4$) are routed to a divider (20), which forms a quotient signal (Q) from the summed signals (Sum 1, Sum 4), wherein a calculator (21) is provided, to which the quotient (Q) is supplied through a signal channel ($SK_5$) and in which two factors ($F_V$, $F_H$) are determined by means of the respective quotient and corresponding front and rear factor signals are provided, wherein the front and rear factor signals are provided to separate pairs of the four multipliers (M1/3, M2/4) that are also responsive to signal channels ($SK_{2.2/3}$, $SK_{3.2/3}$), and wherein at least one other not necessarily audio-signal-suitable A/D converter (14.1) is provided in the first channel between the first adder (12.1) and the multipliers (M1–4).

2. Sound reproduction device as claimed in claim 1, wherein the respective averaging devices (17) for determining the average level value, and the subsequent smoothing devices (18), are each positioned symmetrically with respect to the first and fourth adder (12.1, 12.4).

3. Sound reproduction device as claimed in claim 1, wherein the A/D converters (14.1–3) are directly connected to the first, second and third adders (12.1–3).

4. Sound reproduction device as claimed in claim 3, wherein the averaging devices (17) for determining the average level value are connected before the first adder (12.1).

5. Sound reproduction device as claimed in claim 3, wherein the averaging devices (17) for determining the average level value, which are connected after the A/D converters (14.1–3), form the average level values in accordance with an absolute averaging method.

6. Sound reproduction device as claimed in claim 1, wherein a threshold device (19) precedes the divider (20).

7. Sound reproduction device as claimed in claim 1, wherein the first, second and third adders (12), which are positioned between the fader control (11) and the A/D converters (14.1–3), are combined in an adapter (23).

* * * * *

UNITED STATES PATENT AND TRADEMARK OFFICE
CERTIFICATE OF CORRECTION

PATENT NO. : 5,592,558

DATED : January 7, 1997

INVENTOR(S) : Stuhlfelner et al

It is certified that error appears in the above-indentified patent and that said Letters Patent is hereby corrected as shown below:

At column 6, line 39, please cancel $$o(t+t_s) = i(t) + [b_a + b_r]\ [1/2]\ [o(t) - i(t))] + [b_r - b_a]\ [1/2]\ |[o(t) - i(t)]|$$

and substitute therefor:

$$o(t+t_s) = i(t) + [b_a + b_r]\ [1/2]\ [o(t) - i(t)] + [b_r - b_a]\ [1/2]\ |[o(t) - i(t)]|$$

Signed and Sealed this

Third Day of June, 1997

Attest:

BRUCE LEHMAN

*Attesting Officer* *Commissioner of Patents and Trademarks*